United States Patent [19]

DiGiulio et al.

[11] Patent Number: 4,998,203
[45] Date of Patent: Mar. 5, 1991

[54] POSTAGE METER WITH A NON-VOLATILE MEMORY SECURITY CIRCUIT

[76] Inventors: Peter C. DiGiulio, 628 N. Park Ave., Easton, Conn. 06612; Warren G. Hafner, Terry Hill Rd., Lake Carmel, N.Y. 10512; Henry Stalzer, 237 Middle River Rd., Danbury, Conn. 06810

[21] Appl. No.: 319,908

[22] Filed: Mar. 3, 1989

Related U.S. Application Data

[63] Continuation of Ser. No. 122,580, Nov. 16, 1987, abandoned, which is a continuation of Ser. No. 710,802, Mar. 12, 1985, abandoned.

[51] Int. Cl.$^5$ ............................................. G06F 12/14
[52] U.S. Cl. .................................. 364/464.02; 371/62; 371/67.1; 235/382
[58] Field of Search ................................ 371/67, 62, 67.1; 364/464.02; 235/380, 382, 382.5, 492

[56] References Cited

U.S. PATENT DOCUMENTS

| | | | |
|---|---|---|---|
| 3,978,457 | 8/1976 | Check et al. | 364/200 |
| 4,301,507 | 11/1981 | Soderberg et al. | 364/900 X |
| 4,358,672 | 11/1982 | Hyatt et al. | 235/380 |
| 4,481,604 | 11/1984 | Gilham et al. | 364/900 |
| 4,547,853 | 10/1985 | Eckert | 364/464 |
| 4,566,106 | 1/1986 | Check, Jr. | 371/67 |
| 4,573,141 | 2/1986 | Simon | 364/464 |
| 4,578,774 | 3/1986 | Muller | 364/466 |
| 4,586,179 | 4/1986 | Sirazi et al. | 371/62 X |
| 4,618,953 | 10/1986 | Daniels et al. | 371/62 X |
| 4,627,060 | 12/1986 | Huang et al. | 371/62 |
| 4,675,550 | 6/1987 | Hafner | 307/350 |
| 4,701,856 | 10/1987 | DiGiulio et al. | 364/464 X |
| 4,713,769 | 12/1987 | Hills et al. | 364/464.02 |
| 4,742,469 | 5/1988 | Haines et al. | 364/466 |
| 4,746,818 | 5/1988 | Hafner | 307/363 |
| 4,777,354 | 10/1988 | Thomas | 235/380 |
| 4,837,702 | 6/1989 | Obrea | 364/569 X |
| 4,851,653 | 7/1989 | Limisaque et al. | 235/492 |

*Primary Examiner*—Parshotam S. Lall
*Assistant Examiner*—Edward R. Cosimano

[57] ABSTRACT

An electronic postage meter with a non-volatile memory security circuit apparatus is disclosed. The security circuit comprises means for limiting the amount of time the memories may be continuously enabled, means for preventing simultaneous enabling of both memories and means for preventing the write enabling of a memory if the write enable signal is active before a memory select signal is active. The circuit prevents memory access when a conflict is sensed across in an output related to the non-volatile memories. The security circuit provides additional protection to the non-volatile memory so that valuable critical accounting information located therein cannot be modified or destroyed.

2 Claims, 7 Drawing Sheets

POSTAGE METER WITH A NON-VOLATILE MEMORY SECURITY CIRCUIT

This application is a continuation of U.S. application Ser. No. 122,580, filed Nov. 16, 1987, now abandoned which was a continuation of U.S. application Ser. No. 710,802 filed Mar. 12, 1985 now abandoned.

FIELD OF THE INVENTION

This invention relates to electronic postal mailing systems and in particular to the protection of non-volatile memories utilized in the mailing systems.

BACKGROUND OF THE INVENTION

Electronic postage meters generally comprise an accounting unit with a microprocessor and a non-volatile memory for storing the accounting data. Such a meter is disclosed, for example, in the U.S. patent application Ser. No. 089,413, filed Oct. 30, 1979 and assigned to the assignee of the present application, now U.S. Pat. No. 4,301,507. In this system, the accounting data is stored in the random access memory and retrieved from the random access memory by way of common address and data lines of the microcomputer system. While in most instances it can be assured that the accounting data stored in the memory will be correct, there are certain conditions that can occur that can result in non-detectable errors in the data.

In order to overcome such problems, it has been proposed to employ redundant memories. The microprocessor program for the postal meter thus includes a subroutine for comparing the data stored in the redundant memories to provide an indication of error if the stored data in the two memories is different. While this technique increases the reliability of the stored data, there are certain conditions in which even this type of redundant system will not enable the determination of an error. It must be emphasized that in a postage meter it is critically important that the highest degree of reliability of accounting data be obtained.

In U.S. Pat. No. 4,481,604, for example, a postage meter is described which utilizes dual battery accessed memories (BAMS). The BAMS are utilized as non-volatile memories. In these patents the memories have a battery connected thereto to provide a power source to retain the data in the memory when normal power is removed from the postage meter.

It has also been disclosed, for example, in U.S. patent application Ser. No. 343,877, filed on Jan. 29, 1982 and assigned to the assignee of the present application now abandoned in favor of continuation U.S. application Ser. No. 723,001, which issued as U.S. Pat. No. 4,566,106 that there are other means for minimizing the possibility of error conditions in an electronic postage meter. Thus, in the above application the two redundant memories are interconnected with the processor, i.e., the microcomputer bus by entirely separate groups of data and address lines. As a result of the complete separation of the addressing and data, various error conditions, such as the shorting of a pair of address lines, will not result in the erroneous addressing of both of the memories. Accordingly, under such conditions, the shorting of a pair of address lines will not result in the storage of the same data in both of the memories, so that a comparison of stored data will result in a detection of the error condition.

In accordance with a further embodiment of the above application, corresponding data is applied redundantly to the redundant memories at different times. This may be effected by separately applying the data sequentially to the two memories. Alternatively, data may be simultaneously applied from the two memories, with the data transferred at any instant with respect to the two memories corresponding to different information. As a result, instantaneously occurring transients on the transmission lines will not be likely to effect the corresponding data stored in the two memories in the same fashion. This system thereby minimizes the possibility of non-detectable and/or non-correctable errors resulting from the transients.

While the above identified invention described in the patent application performs its function in exemplary fashion, it is always important to further provide means for protecting the information within an electronic postal mailing system. It is important to develop new and more efficient techniques to minimize these errors because of the information located in the postal non-volatile memories of the meter are postal funds which a consumer has inserted into the meter.

Thus, it is important to develop within a postage meter a circuitry that will further protect the critical accounting information within those non-volatile memories from being effected. It is important that there be a circuitry not only to protect the meter from the possibility of transients effecting the non-volatile memories in an alternative fashion, but there is always a need to prevent any unauthorized signals from entering the memories.

It had been found that random signals, as above described, can enter the memories and thereby destroy information located therein. Thus, it is important that means and ways be developed to prevent those signals, transients or the like from reaching the memory.

SUMMARY OF THE INVENTION

In accordance with one aspect of the invention two non-volatile memories are provided in the accounting unit of an electronic postage meter. The accounting unit in this illustrative embodiment is typically part of an integrated circuit architecture. The accounting unit also includes a microprocessor which is controlled to store the accounting data within the two non-volatile memories. A reset circuit is provided that provides an integrated protection function for the postage meter. The reset circuit includes a security circuit which will protect the contents of the non-volatile memories. In accordance with an illustrative embodiment the reset circuit monitors certain inputs and outputs of the non-volatile memories and the microprocessor to ensure that the accounting data is protected therein.

The non-volatile memory security circuit of this illustrative embodiment comprises, a means for limiting the amount of time either memory may be continuously enabled, means for preventing the simultaneous enabling of both memories, means for preventing the write enabling of either memory if the write enable signal is enacted before the chip enable signal is active, and means for preventing access to either memory when a conflict is sensed across any non-volatile memory related output.

The non-volatile memory security circuit allows for protection for the critical accounting information within postage meters and is part of the reset circuit which is utilized to protect the postage meter. This protection will thereby prevent unauthorized signals from entering the memory and destroying critical accounting information located therein. In addition by the use of this circuit the non-volatile memories will therefore be protected from transient signals and the like.

DETAILED DESCRIPTION

Figure 1:
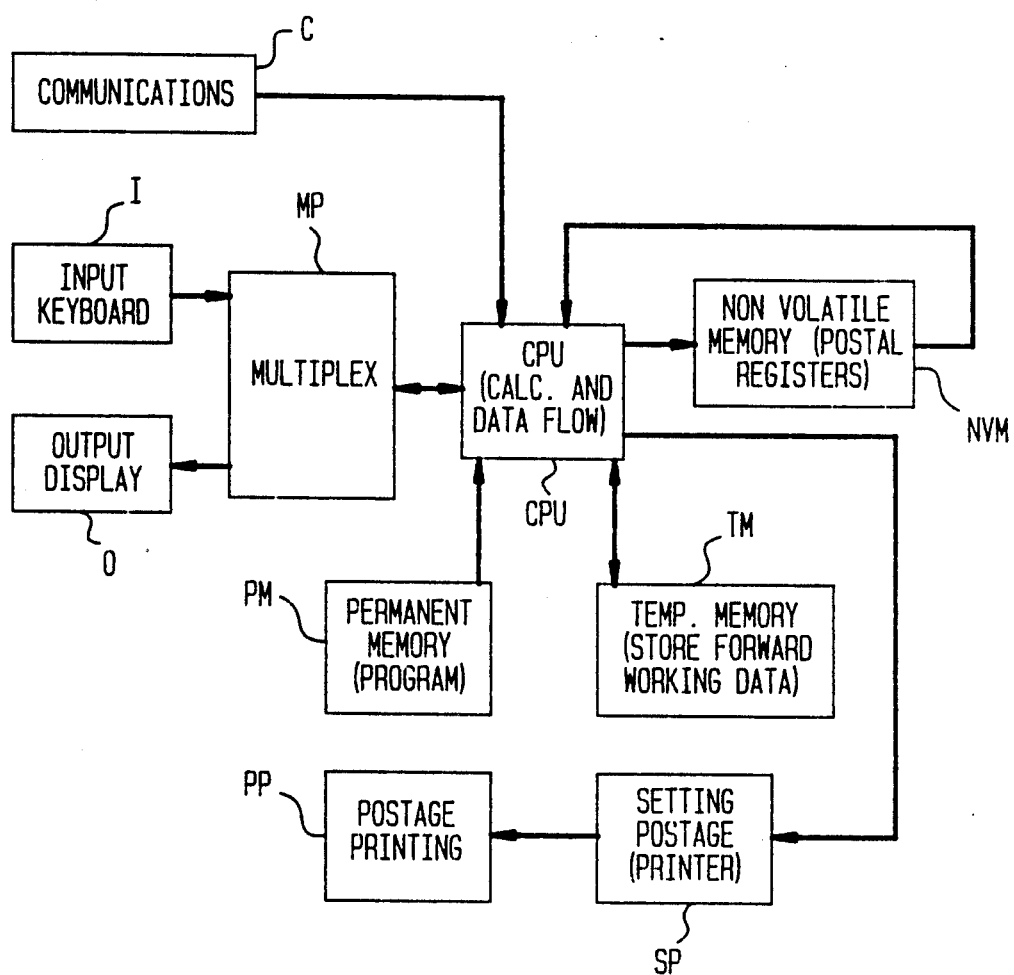
FIG. 1 is a generalized block diagram of a typical postal meter.

Referring now to FIG. 1, a general functional arrangement of a typical computerized postal meter system is shown. The heart of the system is the CPU and it performs two basic functions: performance of calculations based on input data and controlling the flow of data between various memory units. Two basic memory units are employed with the CPU. The first is the permanent memory PM which is a non-alterable memory storing a specific sequence of operations for performing postal data calculations in accordance with certain predetermined inputs as well as performing other routines for operating the system.

The second memory unit is a temporary memory TM which interacts with the CPU for forming a temporary storage, holding and forwarding working data in accordance with the calculations being performed by the CPU. An additional memory component NVM is also coupled to the CPU and performs a storage function which is very significant in the system operation of a postal data system. The NVM is a non-volatile memory which acts to store certain critical information employed in the postal system as part of a predetermined routine activated either upon shut-down or start-up. This routine may be located in the permanent memory and is accessed by appropriate sensing device sensing either of the two stated conditions, shut-down or start-up, for operating the CPU in accordance with that routine.

The function of this routine is to take information stored in the temporary memory TM which represents crucial accounting functions such as descending balances or ascending credits and the like and store them in the NVM (non-volatile memory) wherein they may be held while the machine is deenergized and recalled upon a subsequent start-up. In this manner, the computer system may continually act upon these balances in the temporary memory without fear of loss of this information upon shut-down.

Further, the information may be recalled on reactivation by start-up by retrieving it from the non-volatile memory NVM and feeding it back into the TM via the CPU. The non-volatile memory is shown as coupled to the CPU and deriving an output therefrom in accordance with the transfer of information from the temporary storage TM under the control of the permanent memory PM through the CPU in accordance with the shut-down routine. The NVM unit is also shown as providing an output line coupled back into the CPU for transferring the data back into and through the CPU and into the temporary memory TM in accordance with the start-up routine under the control of the permanent memory PM.

The system operates in accordance with data applied from an appropriate input means I or through a communication device C. This data is fed into the CPU under control of the program in the permanent memory. At any time during the operation of the system, should the contents of the temporary memory storing the appropriate credit debit balances or other accumulations in accordance with the various features of the system be desired to be displayed, an appropriate instruction provided by the input means I causes the CPU to access the desired location TM storing the information requested. The information is provided through the CPU into the output display unit O. The input and output units may be multiplexed by a multiplex unit MP to and from the CPU.

Under control of the CPU when appropriate postal data information is provided from the input I, and all of the conditions such as limits and the like which may be preset in accordance with the entered data in storage in the temporary memory TM, are satisfied, a postage setting device SP will respond to an appropriate output signal from the CPU enabling a postal printing unit PP. At this point, the system has now accomplished its immediate function of setting the postage printer and enabling the printer to print postage.

It is noted that in the above description of a typical postage meter is shown it is well known that typically there are two independent non-volatile memory (NVM) pairs. The reason for having redundant or dual non-volatile memory units being that it is important to make certain that the critical accounting data residing in the postage meter is secure. Thus, by having dual memories, if one memory becomes defective the other memory will still retain the data. There, as before described, several postage meters that utilize the concept of dual redundant non-volatile memories. As before mentioned, a typical postage meter utilizing dual memories is described in U.S. Pat. No. 4,481,604. For the purposes of this description unless indicated otherwise, a low signal indicates an active state and high signal indicates an inactive state.

Figure 2:
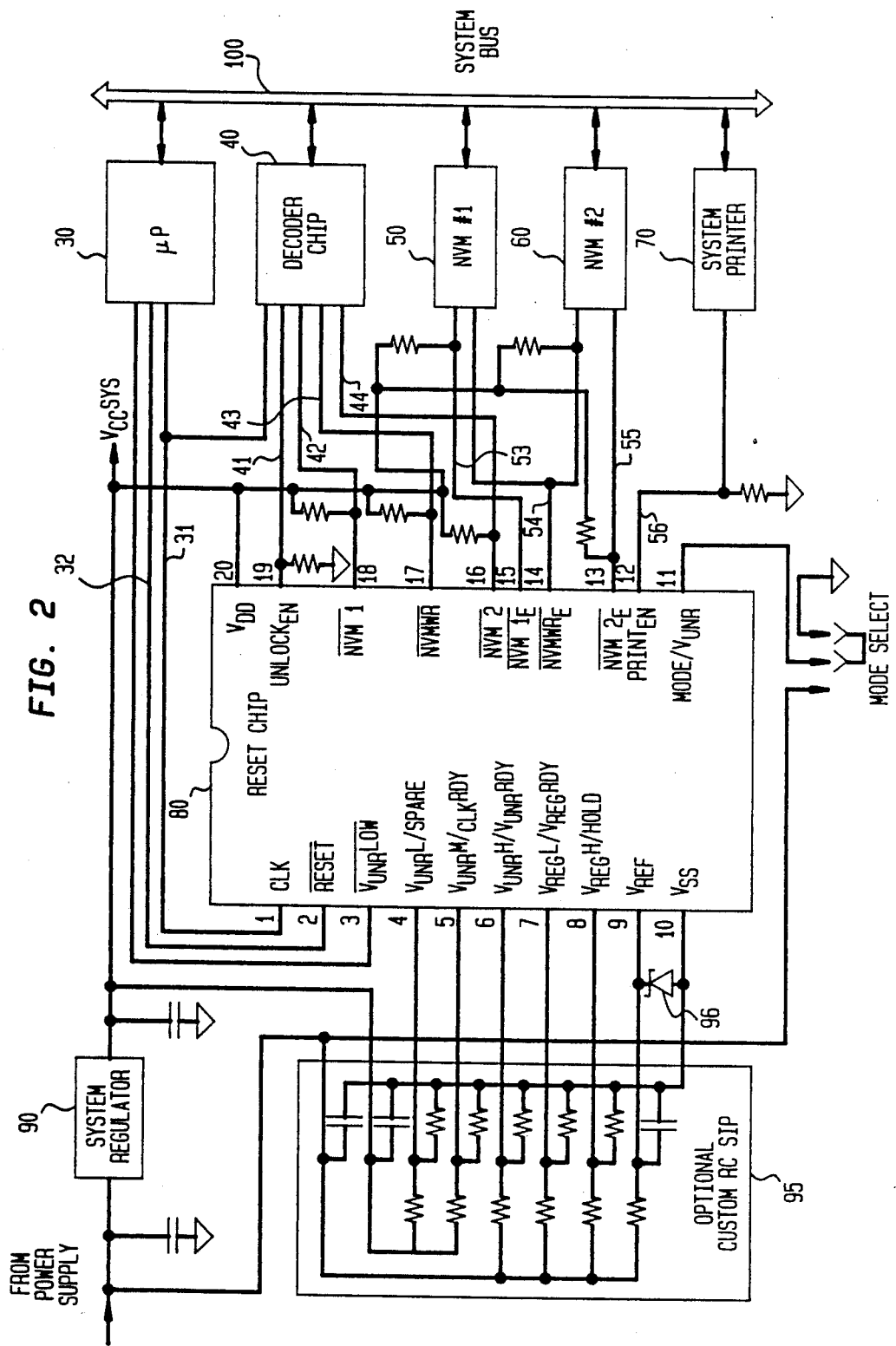
FIG. 2 is a functional diagram of a postage meter utilizing the reset circuit.

FIG. 2 is a functional diagram of a postage meter utilizing a reset circuit of the present invention. As is indicated, there is a reset circuit 80 which embodies the inventive concepts in this application. The reset circuit 80 performs three major functions. The circuit 80 (1) monitors a system clock and various power supply levels of the meter, (2) provides orderly system start up and shutdown operations and (3) provides secured access to critical system non-volatile memories (NVMs) 50 and 60 and also secures system printer 70.

Connected to the reset circuit 80 is a microprocessor 30, an interface circuit 40, non-volatile memories (NVMs) 50 and 60 and a system printer 70. The interface circuit 40 of this embodiment provides the proper address signals to the NVM security circuit 85 (shown in FIG. 3) after receiving input signals from the NVMs 50 and 60.

An interface circuit that could be utilized for this purpose is disclosed in U.S. patent application No. 710,800 entitled ELECTRONIC POSTAGE METER HAVING A MEMORY MAP DECODER filed on Mar. 12, 1985, and assigned to the assignee of the subject application. The circuit disclosed in this application provides the proper select signal only when the appropriate addresses are communicated from the microprocessor 30 so as to particularly ensure the reading and writing of the appropriate data into the appropriate location.

As is also indicated, there is a system bus 100 which provides means for communication between the above-mentioned devices. As is also apparent, the microprocessor 30 is connected to the interface circuit 40 and is also connected via the line 31 to clock input 1 (CLK) of the reset circuit 80. As is also shown, the microprocessor 30 is connected to and in communication with the reset input 2 (RESET) of the reset circuit 80 via line 32. Finally microprocessor 30 is also connected to an input 3 of reset circuit 80 indicated by the $V_{UNR}LOW$ for receiving an indication that the unregulated voltage is low or falling.

The unlock enable $UNLOCK_{EN}$ input 19 of reset circuit 80 is connected to the interface circuit 40 via line 41. The non-volatile memory NVM1 input 18, the non-volatile memory write NVMWR input 17, NVM2 input 16 are all connected to the circuit 40 via leads 42, 43 and 44, respectively. Non-volatile memory output $NVM1_E$ 15 of circuit 80 is connected to the non-volatile memory 50 via line 53, non-volatile memory output $NVM2_E$ 14 is connected to non-volatile memory 60 via line 55. Non-volatile memory write enable output $NVMWR_E$ 13 is connected to both NVM 50 and NVM 60 via line 54. The print enable output 12 $PRINT_{EN}$ of circuit 80 is connected to the system printer through line 56.

As is also indicated on the figure, a mode select line is connected to $MODE/V_{UNR}$ output 11 for providing means to allow the reset circuit 80 to utilize an internal resistor network or to be connected to the optional external network as indicated by RC network 95. This RC network 95 is used to determine the voltage thresholds utilized by reset circuits 80 voltage monitoring function. The voltage reference device 96 is utilized to provide a constant voltage to be used for comparison by the reset circuit's 80 voltage monitoring functions. In this embodiment, the device 96 is represented as a Zener diode, as is well recognized, however the device 96 could be a variety of electronic circuitry and still perform the above-mentioned function.

Figure 3:
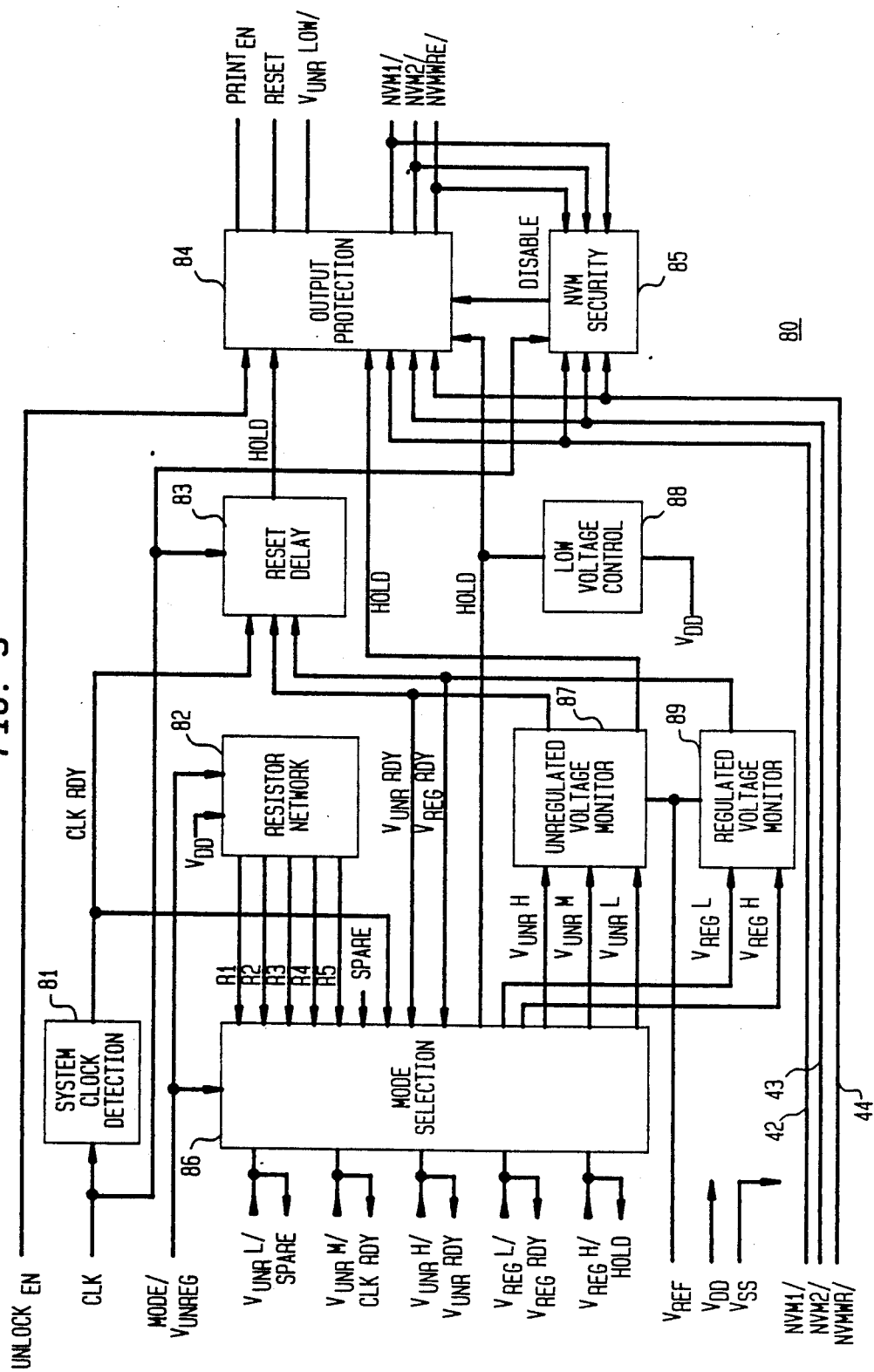
FIG. 3 is a block diagram of the reset circuit of FIG. 2.

FIG. 3 is a block diagram of the internal circuitry of the reset circuit 80 shown in FIG. 2. Output protection circuit 84 is coupled to the reset delay circuit 83, NVM security circuit 85 and a mode selection circuit 86. A typical output protection circuit is described in copending U.S. application Ser. No. 710,798 filed Mar. 12, 1985, entitled CIRCUIT FOR MAINTAINING THE STATE OF AN OUTPUT DESPITE CHANGES IN THE STATE OF AN INPUT, assigned to the assignee of the present application, now U.S. Pat. No. 4,746,818. The output control circuit also provides protection to the system, particularly the non-volatile memories during system transitions. The system clock detection unit 81 is also coupled to the reset delay circuit 83. As is seen, the reset delay circuit 83 is coupled to the regulated monitor 89 and the unregulated monitor 87. The regulated and unregulated monitors 89 and 87 both utilize the reference voltage for comparison to the inputs provided from selection circuit 86. The mode selection circuit 86 is connected to an internal resistor network 82. The mode selection circuit 86 is coupled to and receives signals from the output protection circuit 84.

Figure 4:
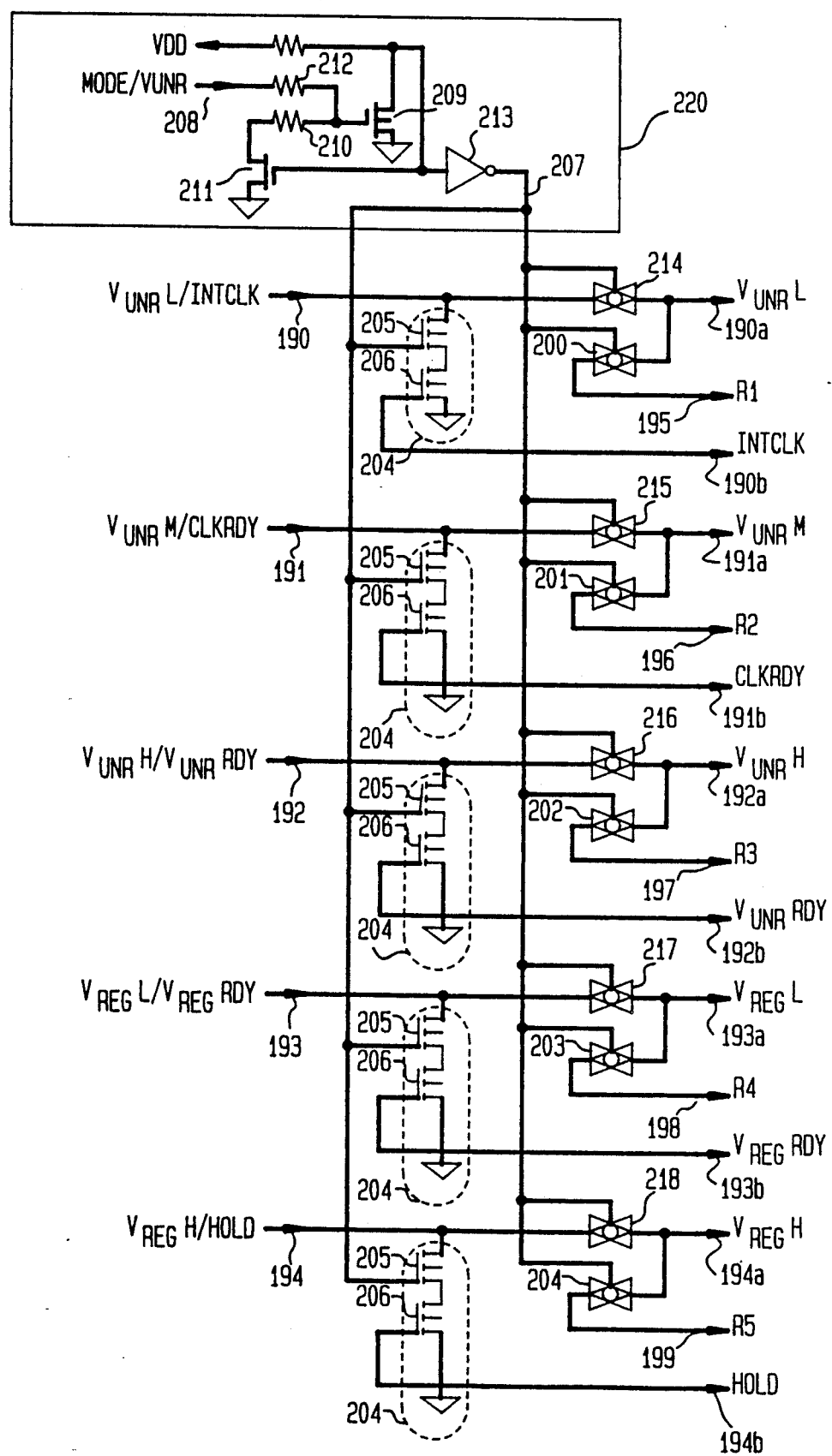
FIG. 4 is a circuit implementation of a mode selection circuit of the reset circuit of FIG. 3.

Referring to FIG. 4, mode selection circuit 86 is shown in circuit implementation. The circuit 86 detects which mode of operation is to be selected by the state of the mode input signal. When the external network mode is selected, the bi-directional inputs are configured as analog inputs, and connected to the voltage monitor inputs. When the internal network mode is selected, the bi-directional pins are configured as open drain digital outputs which can be connected to internal test signals. The inputs from the resistor network 82 (FIG. 3) are connected to the voltage monitor inputs in the internal mode.

Accordingly, the $V_{UNR}L/INTLLK$ 190 bi-directional input is the analog input for the low unregulated voltage monitor output in the external mode 190a and is an open drain internal clock test output 190b in the internal mode. Correspondingly, the $V_{UNR}M/_{CLK}RDY$ 191 bi-directional input is connected to an unregulated mid-range voltage output 191a and an open drain output from an internal clock ready signal 191b for its respective modes, $V_{UNR}H/V_{UNR}RDY$ 192 bi-directional input is connected to an unregulated high voltage output 192a and an open drain output from an internal $V_{UNR}RDY$ signal 192b in its respective modes, $V_{REG}L/V_{REG}RDY$ 193 is connected to a low regulated voltage output 193a and to an open drain output from an internal regulated voltage signal 193b in its respective modes, and $V_{REG}H/HOLD$ 194 is connected to a high regulated voltage output 194a and to an open drain output from an internal hold signal 194b in its respective modes.

As is also seen in the internal network mode, resistor input R1 195 is connected to the $V_{UNR}L$ output 190 a via switch 200, resistor input R2 196 is connected to the $V_{UNR}M$ voltage medium output 191a via switch 201, resistor input R3 197 is connected to the $V_{UNR}H$ output 192a via switch 202, 192a via switch 202, resistor input R4 198 is connected to the $V_{REG}L$ output 193a via switch 203, and resistor input R5 199 is connected to the $V_{REG}H$ out put 194a via switch 204.

The bi-directional inputs 190 through 194 are each connected to a NAND transistor circuit 204. Each circuit 204 contains a pair of transistors 205 and 206 which are coupled together. As is seen, each of the transistors 205 is connected to line 207, the gate of each of their associated other transistors 206 is connected to the internal inputs 190b, 191b, 192b, 193b, and 194b, respectively of the reset circuit.

Referring to $MODE/V_{UNR}$ input 208, the gate of transistor 209 is connected to the input 208 via resistor 212. It is also seen that the supply voltage $V_{DD}$ is connected to the drain of the transistor 209 via a resistor and the source of the transistor 209 is connected to ground. The gate of transistor 209 is also connected to the source of transistor 211 via resistor 210. The gate of transistor 211 is connected to the input of the inverter 213. The output of the inverter 213 is connected to the inputs of switches 200 through 204 and 214 through 218. The output of inverter 213 is also connected to the gates of each of the transistor 205 via line 207. The operation of the mode selection circuit will be discussed in conjunction with the above mentioned circuit arrangement and the following description provided herein below.

The circuit that provides the signal to detect the mode for the bi-directional input is indicated generally by 220 and is described in copending U.S. patent application No. 710,793, filed Mar. 12, 1985, entitled MODE DETECTION CIRCUIT FOR A DUAL PURPOSE ANALOG INPUT and assigned to the assignee of the subject application, now U.S. Pat. No. 4,675,550. The circuit 220 detects whether the reset circuit 80 is in the internal or external mode. Thus in this embodiment once the mode is detected by circuit 220, then the remainder of the mode selection circuit 86 provides an indication via transmission devices as to which input is to be utilized.

Thus, the mode selection circuit 86 allows for utilization of either the internal or external resistor networks. In this embodiment, the bi-directional pin 190 will be described in detail to show the operation of the circuitry. As is indicated, the remaining bi-directional inputs 191 through 194 are connected in the same manner and their operation is exactly the same with the only difference being the input pins.

Thus, referring to bi-directional input $V_{UNR}L$-/HOLD when there is a high signal provided from line 207, transmission gate 214 is turned off, and transmission gate 200 is turned on. The transmission gate 200 provides an indication that connects the input of the internal resistor network to the output $V_{UNR}L$ 190a. The signal via line 220 also turns on transistor 205 which in turn allows transistor 206 to operate as an open drain output which is the inverted signal being fed to it via input line 190b.

On the other hand, when the signal on line 207 is low, transmission gate 214 is turned on, and transmission gate 200 is turned off. The signal also turns off transistor 205 which allows whatever voltage is on the bi-directional input pin 190 to be sent to the $V_{UNR}L$ 190a and prevents the input 190b from affecting the voltage on 190.

Referring back to FIG. 3, a low voltage control circuit 88 is coupled to the output protection circuit 84 and the mode selection circuit 86. A typical low voltage control circuit 88 is described in copending U.S. patent application No. 710,793, filed Mar. 12,1985, entitled "MODE DETECTION CIRCUIT FOR A DUAL PURPOSE ANALOG INPUT", assigned to the present assignee now U.S. Pat. No. 4,675,550. The application discloses a circuit which will hold the circuit output in a known state during the power-up and power-down cycles.

Security circuit 85 is connected to the system clock to receive clock pulses therefrom. Circuit 85 is also coupled to and receives signals from the output protection circuit 84 and the external devices, particularly the interface circuit 40 (FIG. 2) via lines 42, 43, and 44.

As before mentioned, the main purpose of the reset circuit 80 is to monitor different functions that are very critical to the proper operation of the microprocessor 30 and NVMs is 50 and 60 (FIG. 2) of the postage meter. Thus, for example, the system voltages and the system clock must be monitored continuously to ensure that the postage meter is protected. Therefor, in this embodiment, a system clock detection circuit 81 is utilized which determines that a clock signal has come up to some range of frequencies. The system clock detection circuit 81 therefor provides an indication that the system clock is operating at a minimum frequency.

Figure 5:
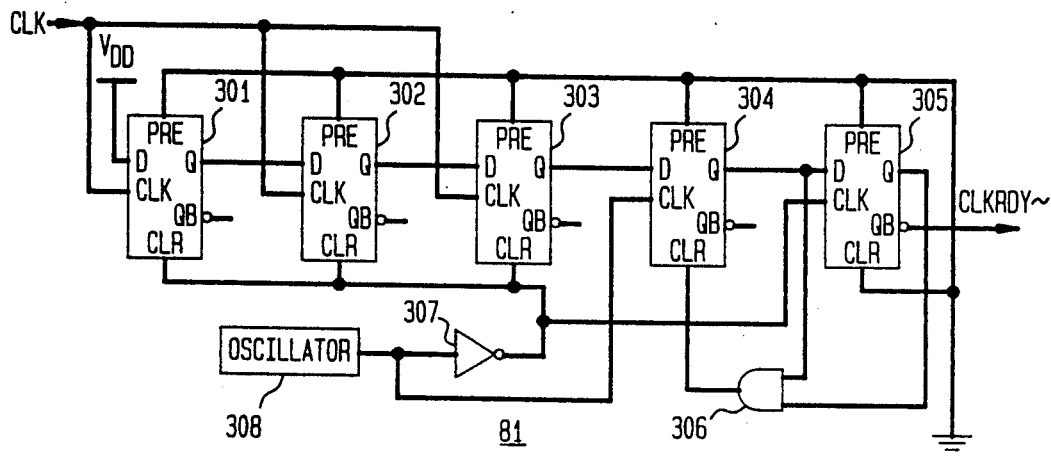
FIG. 5 is a circuit implementation of the system clock detection circuit of the reset circuit of FIG. 3.

Referring to FIG. 5, a system clock detection circuit is described which discloses apparatus for verifying that system clock is providing some predetermined minimum frequency. The clock input is connected to three D FLIP-FLOPs 301, 302 and 303. As is indicated, the input of FLIP-FLOP 301 is connected to the $V_{DD}$ voltage power supply. The Q output of FLIP-FLOP 301 is connected to the input of D FLIP-FLOP 302. Correspondingly, the Q output of D FLIP-FLOP 302 is connected to the Q output of FLIP-FLOP 303. The reset inputs of FLIP-FLOPs 301, 302 and 303 are all connected together and are, in turn, connected to the input of oscillator 308 via an inverter 307. As is also seen, an output from the oscillator 308 is connected to the clock input of D FLIP-FLOP 304. The output from FLIP-FLOP 303 is connected to the D input of FLIP-FLOP 304. The Q output of FLIP-FLOP 304 is, in turn, connected to the D input of FLIP-FLOP 305. As is also indicated, the QB output of FLIP-FLOP 305 provides an output signal indicating that the clock is ready $C_{LK}RDY$.

The Q output of FLIP-FLOP 305 is connected to one of the inputs of AND gate 306. The other input of AND gate 306 is connected to the output from D FLIP-FLOP 304. The AND gate output 306 is connected to the reset input of the FLIP-FLOP 304. The operation of the system clock detection circuit will be discussed in conjunction with the above-mentioned circuit arrangement and the following description provided herein below.

The purpose of the system clock detection circuit 81 is to detect whether a system clock connected to the reset circuit is above some predetermined minimum frequency. Onboard oscillator 308 provides a proper initial frequency for the range that the system clock detection circuit 81 is to operate. In this embodiment, the frequency that is produced by the oscillator 308 would typically be one-sixth of the predetermined frequency provided by the clock normally, due to the actions of the FLIP-FLOPs 301, 302 and 303. Initially, when the reset circuit is first powered up, the oscillator will reset FLIP-FLOPs 301, 302 and 303 which will provide a low output on FLIP-FLOP 303. Within a clock cycle of power up the low signal provided by FLIP-FLOP 303 will be propagated to FLIP-FLOP 304. Accordingly, the Q output from FLIP-FLOP 305 will provide a high signal indicating that the clock is not ready. AND gate 306 is to provide protection during start-up of the system clock because it is not clear initially what states FLIP-FLOPs 304 and 305 are in at that start-up condition. If FLIP-FLOP 304 is powered up with its Q output active, when that state is clocked AND gate 306 provides a reset into FLIP-FLOP 304 allowing an erroneous clock signal to FLIP-FLOP 304 ready indication for less than one oscillator cycle. The time frame for this possible erroneous output is much less than the time of the reset delay and thus the error would not be detected on a chip output.

If there are three low to high transitions from the clock signal through FLIP-FLOPs 301 through 303 before the output of the inverter 307 goes high one time, then an indication that the clock signal is ready will be provided at the output. Accordingly, the clock input of D FLIP-FLOP 304 will change from low to high. Thus, the high output from FLIP-FLOP 303 will be accepted by the input of FLIP-FLOP 304. Thus, the next high to low transition from inverter 307 will propagate a signal from 305 providing an indication that the clock is ready.

In this embodiment, every time the clock ready signal is indicated at the output, FLIP-FLOP 304 will be reset via the action of AND gate 306 to ensure that the high signal is being propagated through the FLIP-FLOPs 301, 302 and 303 during every cycle. Thus, if the clock signal does not operate properly, there is rapid indication that the clock ready output is not at the proper state.

Accordingly, this circuit provides an indication of whether the clock signal is at or above a certain predetermined threshold frequency. Thus, in this embodiment if the CLK input is not operating above that predetermined threshold, there will be an indication that the clock ready $CL_KRDY$ output is not enabled. If the system clock is working above that predetermined threshold, then the clock ready signal will give an indication that it is enabled.

Referring again back to FIG. 3, regulated and unregulated voltage monitors 87 and 89 are utilized to provide an indication of the voltage level of the various power supplies. The output protection circuit 84 will receive signals from the monitors 87 and 89 via reset delay circuit 83 which, until the monitors are operating normally, will block all signals from being obtained at the output, thereby ensuring that the meter remains in a safe condition.

Referring back to FIG. 2, in this embodiment voltage monitoring is accomplished by both monitoring the normal supply system voltage $V_{CC}$ and also monitoring an unregulated power supply $V_{UNR}$ which is provided directly from the power supply which would be expected to fail before the regulated power supplies. Because of these two different points of picking off the supply voltage, an opportunity is available to warn the microprocessor 30 that the power is falling.

When the unregulated voltage, regulated voltage and system clock are all at the proper levels, the reset delay circuit 83 (FIG. 3) begins to count off a predetermined number of pulses from the system clock. Once that predetermined number of pulses has been exceeded, the reset signal is released on the microprocessor 30, and on the interface circuit 40 and normal operation of the meter can begin.

Whenever the reset signal is active or when one of the conditions has not been satisfied, the system printer 70 is locked thereby preventing the imprinting of postage by the meter. Also provided from the interface circuit 40 is an unlock enable signal which gives an indication that is proper to release the printer. The final and most important function of the reset circuit 80 is to protect the critical accounting information of the NVMs 50 and 60.

To accomplish this function, the reset circuit 80 accepts three signals from the interface circuit 40. The first two signals are the NVM1 and NVM2 enable signals and the third signal is the NVMWR signal. The interface circuit 40 and the reset circuit 80 interact to ensure that there is no discrepancy between the outputs on the NVM 50 or 60 and the inputs.

The reset circuit 80 also ensures both NVMs 50 and 60 are not active at the same time. The reset circuit 80 also makes certain that the write line 54 of either non-volatile memory is not activated without activating an enable line first. Furthermore, the reset circuit 80 prevents the NVMs 50 and 60 from being enabled simultaneously. Finally, if any of the NVM enable lines 53, 54 and 55 enabled for more than a certain number of clock cycles, the reset circuit will bring the output signals to a safe condition thereby ensuring protection of the contents located within NVMs 50 and 60.

Essentially, the reset circuit is protecting the NVMs 50 and 60 by detecting a short on the output of the reset circuit 80 and preventing further access to the remaining NVM lines. It is very important to maintain the security of the foregoing so that the critical accounting information of the non-volatile memories are protected.

FIGS. 6 through 9 show circuit implementations for the non-volatile memory security circuit 85, the unregulated power supply monitor 87, the regulated power supply monitor 89 and the reset delay circuit 83. These circuits cooperate with each other and the other portions of the reset circuit to protect the contents of the postage meter. The operation of the above-mentioned circuits along with their description will be described with reference to the above-mentioned figures in conjunction with the following discussion.

Figure 6:
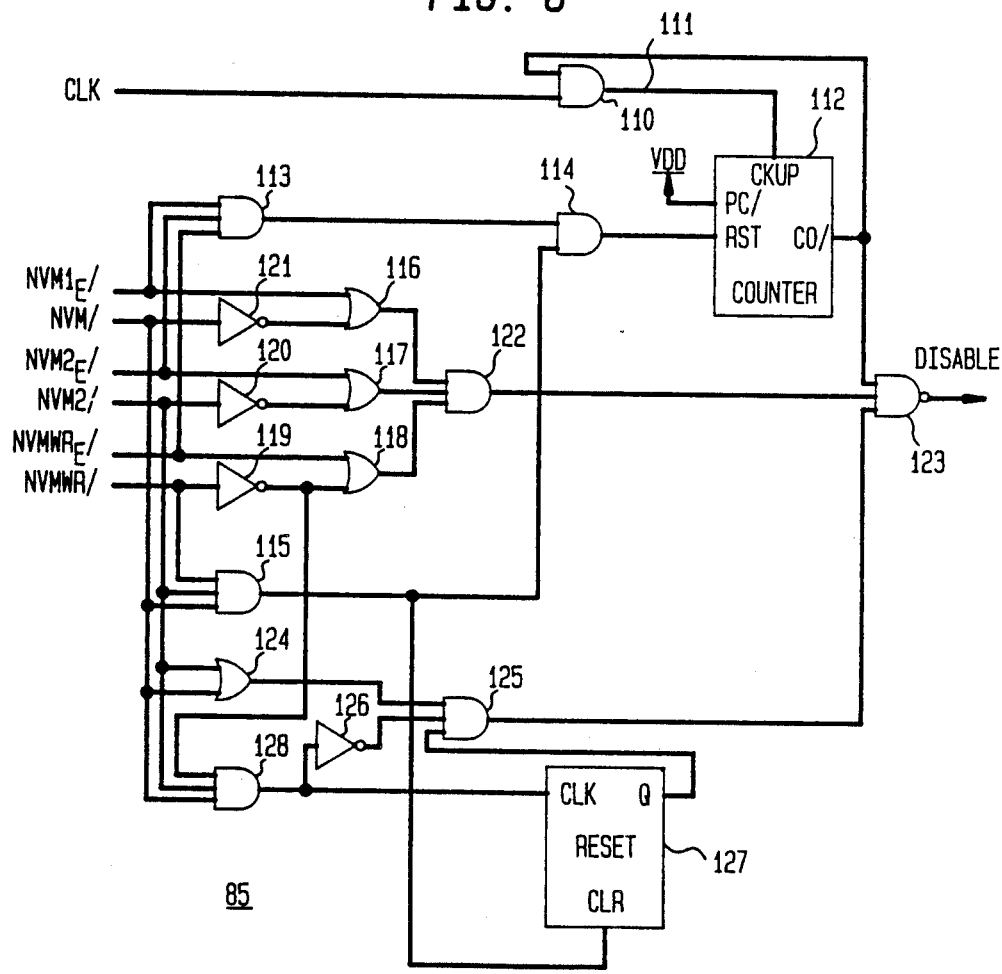
FIG. 6 is a circuit implementation of the non-volatile memory security circuit of the reset circuit of FIG. 3.

FIG. 6 is a circuit implementation of the security circuit 85 of FIG. 3. Security circuit 85 receives signals from the system clock signals from the non-volatile memory inputs, and signals from the non-volatile memory outputs.

Referring to FIG. 6, AND gate 110 is connected via lead 111 to reset counter 112. The AND gate 110 receives the initial clock pulse from the system clock as indicated in FIG. 2. The output of AND gate 113 which is connected to one of the inputs of AND gate 114. The other input of AND gate 114 is connected to the output of AND gate 115. The three inputs of AND gate 113 are connected to $NVM1_E$, $NVM2_E$ and $NVMWR_E$ which are the outputs of the NVMs 50 and 60 (FIG. 2).

The three inputs of AND gate 115 are connected to the $NVM1_E$, $NVM2_E$, and $NVMWR_E$ lines which are the inputs of the NVMs 50 and 60. It is also seen that there are three OR gates 116, 117 and 118, each of which have one input connected to an inverter designated 119, 120 and 121, respectively. The outputs of the OR gates 116, 117 and 118 are connected to the three inputs of an AND gate 122.

The output of the AND gate 122 in turn is connected to one of the three inputs of NAND gate 123. A second input of NAND gate 123 is connected to an input of AND gate 110.

The two inputs of OR gate 124 are connected to the NVM1 and NVM2 inputs from the NVMs 50 and 60. The output of OR gate 124 is connected to a first input of AND gate 125. The output of AND gate 125 in turn is connected to a third input of NAND gate 123. A second input of AND gate 125 is connected to the output of the reset FLIP-FLOP 127.

The three inputs of AND gate 128 are connected to the NVM1, NVM2 and to the output of inverter 119. The output of the AND gate 128 is connected to an inverter 126 which in turn is connected to a third input of AND gate 125.

Also AND gate 128 is connected to the clear input of FLIP-FLOP 127. The set input of FLIP-FLOP 127 is connected to the output of AND gate 115. The operation of the security circuit will be explained in conjunction with FIG. 6 and the following discussion.

As shown in the NVM security circuit of FIG. 6, the OR gates 116, 117 and 118 are comparing the one input to its respective output to ensure that there is never an output signal that is low when the input signal is high. Thus, for example, if the $NVM1_E$ output is low and the NVM1 input is high, then there will be a high output through the OR gate 116. Accordingly, a zero will be provided to the input of AND gate 12 will, in turn, provide a zero or a low output. Thus, NAND gate 123 will be given a signal that indicates disabling all of the outputs of the NVMs 50 and 60. This is accomplished through the action of the output protection circuit 84 (FIG. 3) which, in effect, as before mentioned, blocks all output signals when the disable signal is delivered to it.

Provided to the inputs of AND gate 115 are the outputs of the NVMs 50 and 60. Accordingly, when the inputs of AND gates 113 and 115 are all high, then AND gate 114 will provide a reset signal to counter 112. Thus when all inputs are high to the non-volatile memory simultaneously and the outputs are high to the non-volatile memory simultaneously, the counter can be reset. This is the only way to reset the counter 112. The function of counter 112 is to ensure that the time limit is not being exceeded in holding the outputs of the non-volatile memories enabled. Thus if reset input of the counter 112 is inactive (indicating that one of the NVM lines is active) for more than a predetermined number of cycles, a signal is received at NAND gate 123 that the outputs should be disabled.

Once the counter 112 reaches that predetermined number, for example, 16 clock cycles, the output of counter 112 will go low thereby disabling the clock input to the counter 112 by the action of AND gate 110. This effectively latches the disable signal provided by NAND gate 123. As before mentioned, the disable signal will remain until all of the input and outputs have gone to a high state again. Thus, for example, if there is a short at the input or output, the signals from the two AND gates 113 and 115 will ensure that the memories in the postage meter will be locked out, and it will be impossible to read information from or write information to the NVMs 50 and 60.

The OR gate 124, primarily ensures that NVM1 and NVM2 inputs are never active at the same time. This is necessary because under normal operating conditions of the postage meter both signals should not be active or enabled even if they are both being read at the same time. The AND gate 128 is utilized to ensure that the NVM write input does not go active before one or the other NVM output lines. Thus, in effect, the circuit is not enabled before the NVM write signal is enabled.

The OR gate 124 and AND gate 128 provide protection to the circuit in the following manner. The NVM$_{WR}$ write input is provided to the AND gate 128 in an inverted state via inverter 119. Thus, if NVM1 and NVM2 are both inactive (both being high), and the NVM write line is low. Then the AND gate 128 will be high which clears FLIP-FLOP 127. The disable output will go high due to the action of AND gate 125 and NAND gate 123. The only method for removing or clearing this latching of the D FLIP-FLOP 127 is for all of the inputs from AND gate 115 to return to ones or inactive. Once all of the NVM inputs return to one or the inactive state, the D FLIP-FLOP 127 will be set thereby removing the disable signal provided by AND gate 125. Thus, the security circuit 85 is ensuring that all the inputs to the NVMs 50 and 60 and the outputs to the NVM are high or inactive before the FLIP-FLOP 127 is reset.

The non-volatile memory security circuit 85 thereby performs the functions of limiting the amount of time the memories may be continuously enabled preventing the simultaneous enabling of both memories and also prevents the write enabling of the memory if the write enable signal is inactive before the circuit enable signal is inactive. The NVM security circuit also prevents memory access when a conflict is sensed across an output or an input related to the non-volatile memories. The security circuit provides additional protection to the non-volatile memories so that the valuable critical accounting information located therein cannot be modified or destroyed.

Figure 7:
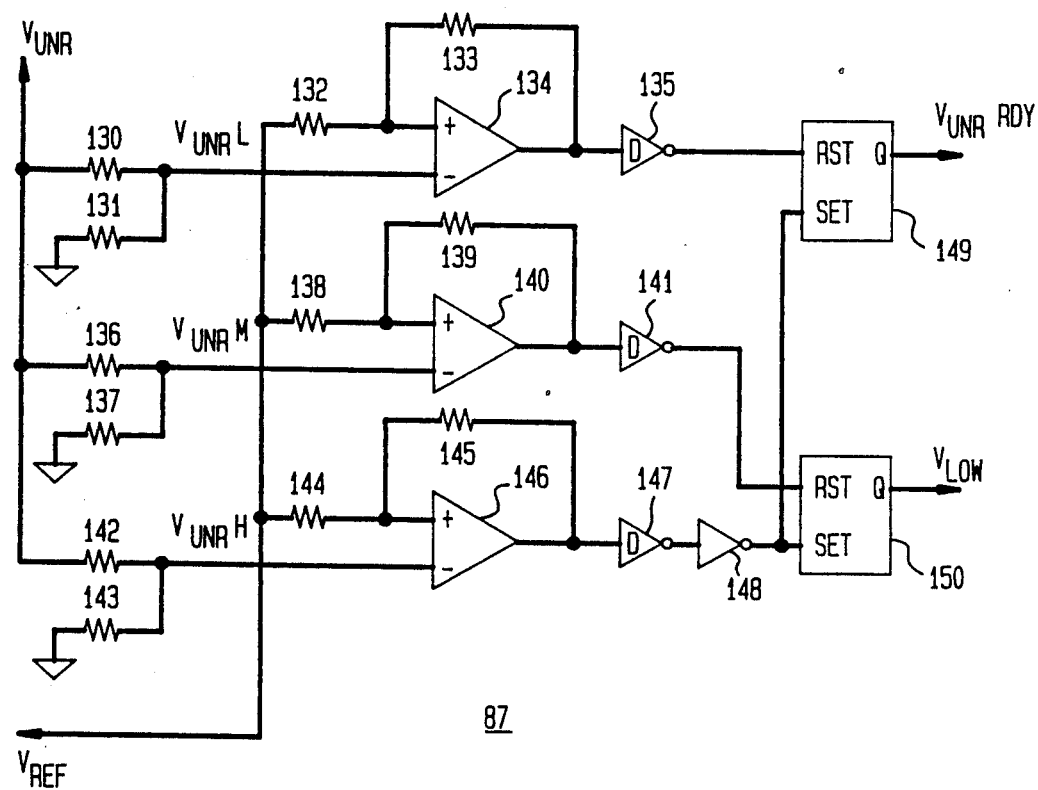
FIG. 7 is a circuit implementation of the regulated voltage monitor of the reset circuit of FIG. 3.

FIG. 7 is a circuit implementation of the unregulated voltage monitor 87. The unregulated voltage $V_{UNR}$ is connected to the negative inputs of comparators 134, 140 and 146 via resistors 130, 136 and 142, respectively. As is also seen, resistors 131, 137 and 143 are connected to resistors 130, 136 and 142. The opposite end of resistors 131, 137 and 143 are connected to ground. The positive inputs of comparators 134, 140 and 146 are connected to a reference voltage via resistors 132, 138 and 144, respectively.

Resistors 133, 139 and 145 are also connected in feedback relationship with the positive inputs with comparators 134, 140 and 145, respectively. The resistors 133, 139 and 145 in combination with resistors 132, 138 and, 144 provide hysterisis for their comparators switch point. The output of comparator 145 is connected to schmitt trigger 147 and the output of schmitt trigger 147 is connected to the input of inverter 148. Inverter 148 is, in turn, connected to the set input of the FLIP-FLOP 150. The output of the hysterisis device or schmitt trigger 141 is connected to the reset input for FLIP-FLOP 150. The set input of FLIP-FLOP 150 is also connected to the set input FLIP-FLOP 149. The output of hysterisis device or schmitt trigger 135 is connected to the reset input of FLIP-FLOP 149. As is seen, the Schmitt triggers 135, 141 and 147 are inverters. The Q output of the FLIP-FLOP 149 provides an indication that the unregulated voltage is at the proper level. The Q output of FLIP-FLOP 150 provides an indication of whether the voltage is low or falling.

In this embodiment, comparators 134, 140 and 146 are comparing a reference voltage $V_{REF}$ to the voltage of the unregulated power supply. The unregulated voltage is divided into three different threshold levels. The comparator 134 represents the lowest threshold voltage, 140 represents the middle range threshold voltage, and 146 represents the highest threshold voltage.

Initially, the comparators 134, 140 and 146 will be inactive so that the input to the two FLIP-FLOPS 149 and 150 can be reset. In addition, the set inputs will be low, thus the Q output of each FLIP-FLOP will be low indicating that the unregulated voltage is low and the unregulated voltage is not at its appropriate level.

As the voltage increases and the lowest threshold voltage $V_{UNR}$LOW is exceeded, the output of the comparator 134 changes from its inactive state (one) to an active state (zero). However, since the set input of FLIP-FLOP 149 is zero, the output of the FLIP-FLOP 149 will remain at zero. Thus, the output of FLIP-FLOP 149 will still be providing an indication that the unregulated voltage supply is not high enough.

When the middle range unregulated voltage $V_{UNR}$M is exceeded, the output of comparator 140 will provide a zero to the input of the reset of FLIP-FLOP 150 and there are two zero inputs at the FLIP-FLOP 150. Accordingly, FLIP-FLOP 150 the output will remain at zero. Accordingly, there is no change on the output and thus the output of FLIP-FLOP 150 will still be indicating that voltage is low.

Finally, as the unregulated voltage exceeds the highest threshold voltage $V_{UNR}H$ the output from schmit trigger 147 will change from a one to a zero. The output of the schmitt trigger 147 is inverted via inverter 148 and will provide a one to both of the set inputs of the FLIP-FLOPs 149 and 150. Thus, this is the first state transition of the FLIP-FLOP output 149 and 150. Thus, at this state, the Q output of FLIP-FLOP 149 will be active giving an indication that the unregulated voltage is ready and the Q output of FLIP-FLOP 150 will be active given an indication the voltage is no longer low.

As the nominal level of the unregulated voltage supply goes down, the first threshold voltage that will be encountered is the highest threshold voltage $V_{UNR}H$. At this point, the output of comparator 146 will be changing from a zero to a one and therefore the output of the inverter 147 will change from a one to a zero. At this point there are two zeros on the input to FLIP-FLOP 149 and 150. Thus, there is no state change of either FLIP-FLOP.

The next threshold that is reached is the unregulated mid-range threshold $V_{UNR}M$. Accordingly, the output of the comparator 140 will change from zero to one, and the reset input on the FLIP-FLOP 150 will change to a high. The Q output of FLIP-FLOP 150 will therefore change to a high. Thus, there will be an indication at the output of FLIP-FLOP 150 that the voltage is low or declining.

Finally, as the voltage continues down to below the unregulated low threshold voltage $V_{UNR}L$, the output on the comparator 134 will change from a zero to a one. The input to the reset line of FLIP-FLOP 149 will change from a zero to a one thereby resetting FLIP-FLOP 149. The output of FLIP-FLOP 149 changes back to a one, thus providing an indication that the unregulated voltage is no longer at an appropriate level.

When the unregulated voltage is above a high range, the monitor 87 will provide a signal to the reset delay circuit 83 to allow for its activation. The voltage monitor 87 will provide a signal to the output protection circuit 84 that the voltage is falling below a certain level $V_{LOW}$. The monitor 87 will also provide a signal to the reset delay circuit 83 to prevent activation of the circuit when the unregulated voltage is not at an appropriate level.

Figure 8:
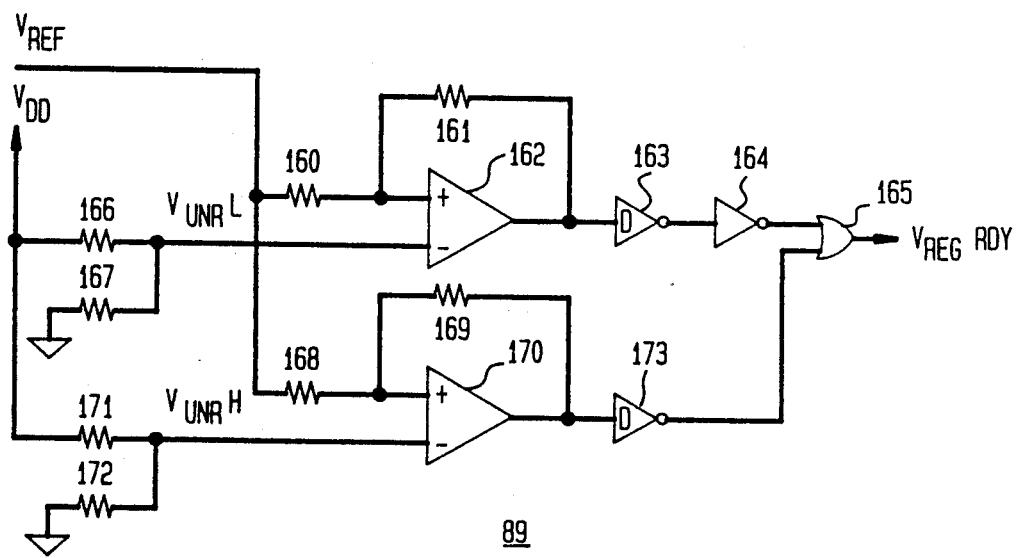
FIG. 8 is a circuit implementation of an unregulated voltage monitor of the reset circuit of FIG. 3.

FIG. 8 is a circuit implementation of the regulated voltage monitor 89. As indicated in the figure, a reference voltage VREF is provided to the positive inputs of comparators 162 and 170 via resistors 160 and 168, respectively. Resistors 161 and 169 are connected in feedback relationship with comparators 162 and 170. At the negative inputs of comparators 161 and 170 there is provided a system voltage indicated by $V_{DD}$ via resistors 166 and 171, respectively.

Also, one end of each of the resistors 167 and 172 are connected to resistors 166 and 171 while the other end of each of the resistors 167 and 172 is connected to ground. Hysterisis devices or schmitt triggers 163 and 173 are connected at the outputs of comparators 162 and 170, respectively.

The output of hysterisis device or schmitt trigger 163 is connected to the input of the inverter 164. The output of the inverter 164 is, in turn, connected to a first input of OR gate 165. The output of hysterisis device or schmitt trigger 173 is connected to a second input of the OR gate 165. The output of the OR gate 165 provides an indication of whether the regulated power supply is at the proper level.

At the initial condition, the supply voltage, $V_{DD}$, will be at zero voltage and both of the outputs of the comparators will be high or inactive. The output $V_{REG}RDY$ will be high providing an inactive signal to the reset circuit. As the voltage starts exceeding threshold voltage $V_{REG}L$, the output from comparator 162 will change from one to zero. Accordingly, the OR gate 165 will provide a zero to the output indicating that the regulated voltage is ready. As the voltage exceeds the higher threshold of voltage $V_{REG}H$, the output of the comparator 170 will change from a one to a zero. Thus, the output from inverter 173 will change from a zero to one and the output through the OR gate 165 will be high indicating that the regulated voltage is not ready, it being too high.

Voltage monitor 89 in effect monitors for whether a voltage is too high or too low. When the regulated voltage is between the two threshold voltages, then the regulated voltage supply is ready. When, however, the voltage is below the first threshold voltage of comparator 162 or above the second threshold voltage of comparator 170, the regulated voltage monitor will then provide a signal to the reset delay circuit 83 to prevent activation until the regulated voltage supply is at an acceptable level.

Figure 9:
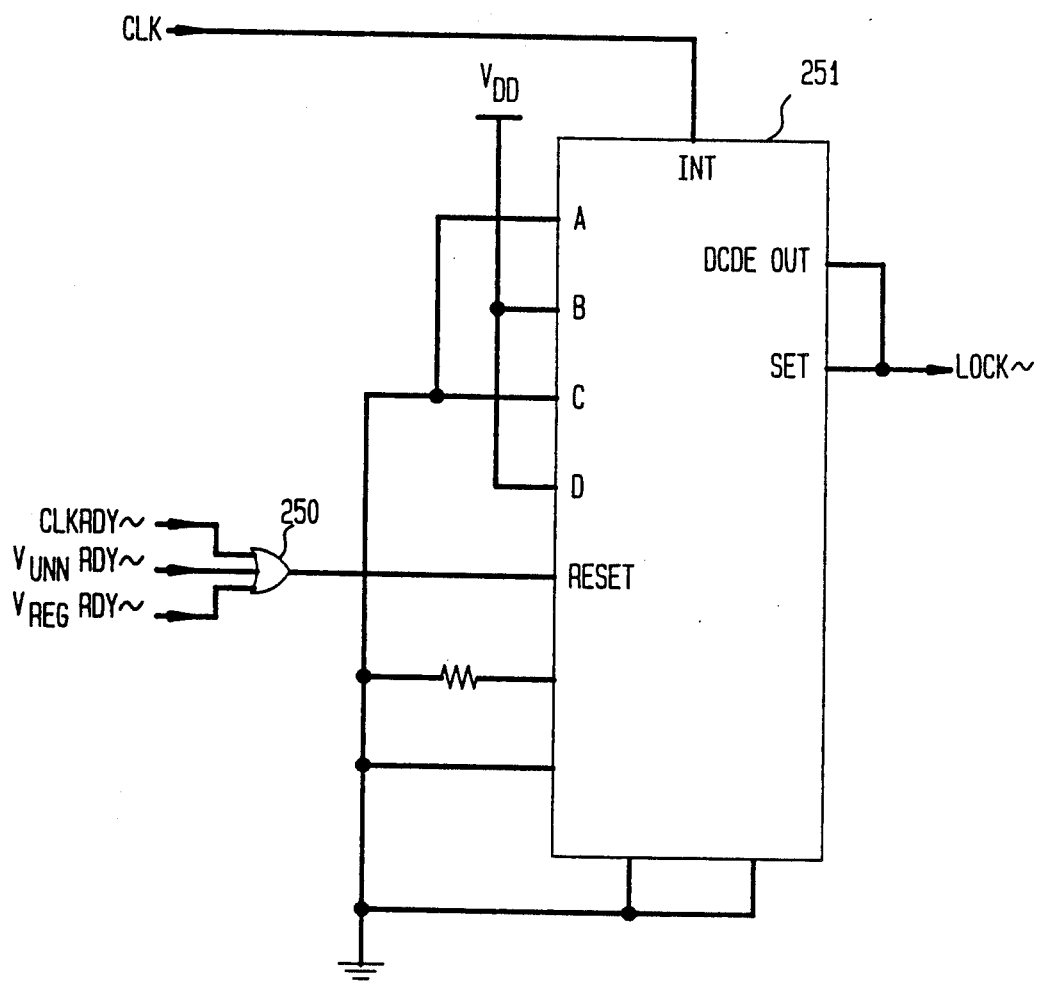
FIG. 9 is a circuit implementation of the reset delay circuit of the reset circuit of FIG. 3.

FIG. 9 is a circuit implementation of the reset delay circuit 83. The reset delay circuit 83 comprises a three input OR gate 250 and counter 251. The OR gate 250 receives a $CLK$RDY~signal, the $V_{UNR}$RDY~signal and the $V_{REG}$RDY~signal. When all of the inputs are providing an active signal to the OR gate 250, the reset input of counter 251 becomes active.

The counter 251 also receives a clock signal for timing and for counting. Thus, the counter 251 is set to count a certain number of clock cycles when the reset signal on the OR gate 250 becomes inactive. Once a predetermined number of clock cycles (for example $2^{19}$ clock cycles) have occurred, the output signal will change state indicating an inactive output. The set input of counter 251 will also become inactive which will in turn lock up the counter 251.

Thus, the reset delay circuit 83 receives input signals from the clock detection circuit 81, the unregulated voltage monitor 87, and the regulated voltage monitor 89. When all of these inputs are at the appropriate levels, the circuit 83 provides for a delay before commencing any postage meter operation. This reset delay circuit 83 eliminates the need for external capacitors to be used in the timing function of the meter.

The reset circuit of this invention in conjunction with other portions of the postage meter provides protection for the sensitive accounting information located therein. It is well known to those skilled in the art that the different circuits contained within the reset circuit of this embodiment could be implemented utilizing integrated circuit technology that would allow for miniaturization thereof. It is also well known that this circuit can be utilized in various microprocessor based system. It is further known that this reset circuit could be utilized in circuitry where voltage levels are critical. Finally, this circuit could be utilized in any type of system in which there is sensitive information in non-volatile or other core type memory.

The above-described embodiment can be modified in a variety of ways and those modifications would still be within the spirit and scope of applicants' invention.

Thus, while this invention has been disclosed by means of a specific illustrative embodiment, the principles thereof are capable of a wide range of modification by those skilled in the art within the scope of the following claims.

What is claimed is:

1. In an electronic postage which includes a processing means and a first and second non-volatile memory connected to the processing means, the first and second memory means arranged for storing critical accounting information received from the processing means, security apparatus for providing security to the critical accounting information within the first and second non-volatile memory means, the security apparatus comprising, means connected to the first and second memory means for limiting the amount of time the first or second memory means is enabled by said processing means, means connected to the limiting means for preventing the simultaneous enabling of the first and second non-volatile memory means, and means connected to the first and second memory means for preventing writing to either of the non-volatile memory means before a non-volatile memory means is selected by the processing means.

2. In an electronic postage meter which includes a processing means and a first and a second non-volatile memory means connected to the processing means, the improvement comprising security apparatus connected to said processing means and said first and second non-volatile memory means, said security apparatus limiting the amount of time for writing into said non-volatile memory means to a predetermined time interval after a non-volatile memory selection signal has enabled writing to said non-volatile memory means.

* * * * *